(12) United States Patent
Newald

(10) Patent No.: US 8,356,201 B2
(45) Date of Patent: Jan. 15, 2013

(54) METHOD, CAN BUS DRIVER AND CAN BUS SYSTEM FOR THE RECOVERY OF A CLOCK FREQUENCY OF A CAN BUS

(75) Inventor: Josef Newald, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 615 days.

(21) Appl. No.: 12/524,883

(22) PCT Filed: Feb. 5, 2008

(86) PCT No.: PCT/EP2008/051414
§ 371 (c)(1),
(2), (4) Date: Mar. 11, 2010

(87) PCT Pub. No.: WO2008/110414
PCT Pub. Date: Sep. 18, 2008

(65) Prior Publication Data
US 2010/0180142 A1    Jul. 15, 2010

(30) Foreign Application Priority Data
Mar. 9, 2007    (DE) .......................... 10 2007 011 684

(51) Int. Cl.
*G06F 1/06* (2006.01)
(52) U.S. Cl. .......................... 713/500; 713/375; 713/501
(58) Field of Classification Search .................. 713/375, 713/500, 501
See application file for complete search history.

(56) References Cited

U.S. PATENT DOCUMENTS

| 7,171,573 | B2 | 1/2007 | Scheele | |
|---|---|---|---|---|
| 7,478,234 | B2 * | 1/2009 | Fredriksson | 713/151 |
| 2006/0142061 | A1 | 6/2006 | Steffan | |
| 2007/0014339 | A1 * | 1/2007 | Yanagida et al. | 375/220 |

FOREIGN PATENT DOCUMENTS

| DE | 10333932 | 2/2005 |
|---|---|---|
| DE | 10200462210 | 5/2006 |
| EP | 0986202 | 3/2000 |
| GB | 2360152 | 9/2001 |

OTHER PUBLICATIONS

International Search Report, PCT International Patent Application No. PCT/EP2008/051414, dated May 9, 2008.

\* cited by examiner

*Primary Examiner* — Albert Wang
(74) *Attorney, Agent, or Firm* — Kenyon & Kenyon LLP

(57) ABSTRACT

A method, a CAN bus driver and a CAN bus system for the recovery of a clock frequency of a CAN bus, which couples a master device, that has a clock generator for providing the clock frequency, to at least one slave device. A phase-locked loop is used in the slave device, in this context, which utilizes a predetermined bit pattern, that is extracted from a frame sent by the master device via the bus system, as reference signal.

16 Claims, 2 Drawing Sheets

METHOD, CAN BUS DRIVER AND CAN BUS SYSTEM FOR THE RECOVERY OF A CLOCK FREQUENCY OF A CAN BUS

FIELD OF THE INVENTION

The present invention relates to a method, a CAN bus driver and a CAN bus system for the recovery of a clock frequency of a CAN bus having a master device that has a clock generator and at least one slave device.

BACKGROUND INFORMATION

Slave devices coupled using the CAN buses, such as intelligent sensors or actuators, are disadvantageously encumbered with high costs of evaluation electronics. This is caused in substantial proportion by the quartz oscillator required for the CAN operation. More cost-effective ceramic resonators fulfill the accuracy requirements for the CAN bus and the CAN interface in only an insufficient manner, or rather, should also not be used for reasons of cost.

SUMMARY

A method according to an example embodiment of the present invention for recovering a clock frequency of a CAN bus, an example CAN bus driver, and an example CAN bus system each have the advantage of providing the clock frequency of the CAN bus to a slave device coupled to the CAN bus in a cost-effective, and particularly in a simple manner.

Furthermore, according to the present invention, the clock frequency of the CAN bus is made available to a slave device coupled to the CAN bus without the use of ceramic resonators or a quartz oscillator in the slave device.

According to an example embodiment of the present invention, a method is provided for recovering a clock frequency of a CAN bus having a master device that has a clock generator and at least one slave device, which includes the steps:

a) providing the clock frequency by the clock generator;

b) sending at least one frame, that includes at least one predetermined bit pattern, at the provided clock frequency, by the master device via the CAN bus;

c) receiving the frame sent by the slave device;

d) extracting the predetermined bit pattern from the received frame;

e) equipping the slave device with a phase-locked loop; and f) operating the phase-locked loop using the extracted, predetermined bit pattern as a reference signal for the recovery of the clock frequency of the CAN bus in the slave device.

Furthermore, an example CAN bus driver is provided for recovering a clock frequency of a CAN bus which couples a master device, that has a clock generator, which provides the clock frequency of the CAN bus, to at least one slave device, the CAN bus including:

a) a receiving device which receives frames, sent by the master device via the CAN bus, which each include at least one predetermined bit pattern;

b) an extraction device that extracts the predetermined bit pattern from the respective received frame; and c) a phase-locked loop which uses as reference signal the extracted, predetermined bit pattern for the recovery of the clock frequency of the CAN bus in the slave device.

Moreover, an example CAN bus is proposed which includes:

a) a CAN bus which couples a master device to at least one slave device;

b) a master device which has a clock generator that provides a clock frequency for the CAN bus, and a sending device which sends frames, having the clock frequency, via the CAN bus, which each include a predetermined bit pattern; and c) at least one slave device which has at least one CAN bus driver as described above.

One advantage of the example embodiment of the present invention is that, because of the phase-locked loop according to the present invention, a simple, and particularly also a cost-effective possibility is provided in the slave device of recovering the clock frequency of the CAN bus in the slave device. Consequently, the number of quartzes or quartz oscillators required in a CAN bus system or a CAN interconnection is reduced by N−1, N representing the number of the nodes in the CAN interconnection. The master device in the CAN interconnection is particularly able to determine the data transmission rate, a change or a flexible adjustment within the normal scope being possible at any time. Therefore, according to the example embodiment of the present invention, this change also has to be made only in the master device. An automatic reduction in the baud rate, so as to reduce the current consumption or in standby operation, is also possible in a simple manner, according to the present invention.

According to one preferred embodiment of the present invention, the phase-locked loop is furnished with at least one free-running, voltage-controlled oscillator, whose output frequency is controlled by its input frequency, and furnished with a phase detector whose output voltage is made available as a function of a phase difference between the output frequency of the voltage-controlled oscillator and the extracted, predetermined bit pattern. The input frequency of the voltage-controlled oscillator is at least a function of the output voltage of the phase detector, or is equivalent to it. The voltage-controlled oscillator is operable particularly in one or more predetermined frequency range(s) having the clock frequency of the CAN bus.

According to one additional preferred embodiment, the phase-locked loop is operated up to at least one adjusted state, at which the output frequency of the voltage-controlled oscillator is at least essentially equivalent, or equivalent to the clock frequency of the CAN bus.

According to another preferred embodiment, the master device sends in each case one frame via the CAN bus, at least at predetermined sending times.

According to another preferred refinement of the present invention, at the respective sending time, the master device sends a data frame which has a header part having the predetermined bit pattern and a data part, in case, at the respective sending time, there is present at the master device a data frame that is to be sent. If there is no data frame present at the master device, that is to be sent, at the respective sending time, the master device sends a dummy frame. The dummy frame has at least one header part having the predetermined bit patterns.

According to one additional preferred embodiment, the predetermined bit pattern is a synchronization pattern of a codec.

According to yet another preferred embodiment, the clock generator is developed as an oscillator having a quartz oscillator. In order constantly to have bit patterns or synchronization patterns available to the slave device, the master device is always able to send a very low-priority communication or message via the CAN bus. In order for the synchronization pattern be known to the slave device in advance, it may use an ID of a reception communication or a reception message. If the slave device needs additional synchronization patterns, it is able to force error frames, so that the current message is repeated. The slave device will do this particularly when it loses synchronization but it is not allowed to miss any communication or frame or message. It is clear to one skilled in the art that the slave device sends only when the phase-locked loop is locked.

BRIEF DESCRIPTION OF THE DRAWINGS

Exemplary embodiments of the present invention are shown in the figures and are explained in greater detail below.

DETAILED DESCRIPTION OF EXAMPLE EMBODIMENTS

In the figures, the same reference symbols identify the same components or components having an identical function.

Figure 1:
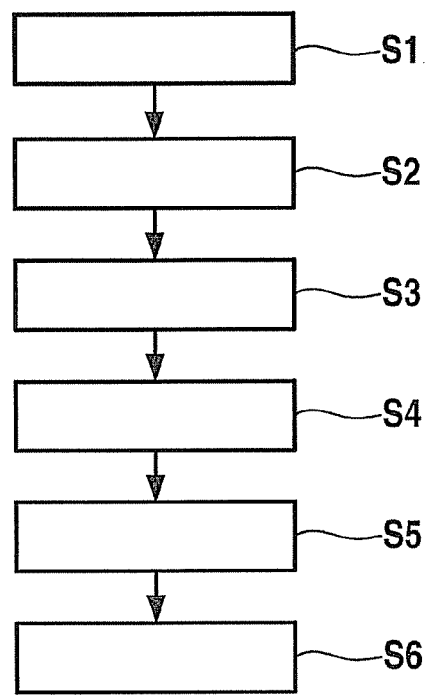
FIG. 1 shows a schematic flow chart of an exemplary embodiment of a method according to the present invention.

FIG. 1 shows a schematic flow chart of an exemplary embodiment of the example method according to the present invention, for recovering a clock frequency T of a CAN bus 1, having a master device 2 that has a clock generator 3, and at least one slave device 4.

The example method according to the present invention is described below, with the aid of the block diagram in FIG. 1, with reference to the schematic block diagrams of FIGS. 2 and 3. The exemplary embodiment of the method according to the present invention according to FIG. 1 has the following method steps S1 to S6:

Method Step S1:
Clock frequency T of CAN bus 1 is provided by clock generator 3 of master device 2. Clock generator 3 is particularly developed as an oscillator having a quartz oscillator.

Method Step S2:
At least one frame R, particularly a predetermined number of frames R, is/are sent at the provided clock frequency T by master device 2 via CAN bus 1. One frame R includes at least one predetermined bit pattern B. In particular, master device 2, at least at predetermined sending times, respectively sends one frame R via CAN bus 1.

At the respective sending time, master device 2 sends a data frame which has a header part having the predetermined bit pattern B and a data part, in case, at the respective sending time, there is present at the master device 2 a data frame that is to be sent. If, however, there is no data frame present at master device 2, that is to be sent, at the respective sending time, master device 2 sends a dummy frame. The dummy frame has at least one header part having the predetermined bit pattern B. Predetermined bit pattern B is particularly a synchronization pattern of a codec.

Method Step S3:
Respectively sent frame R is received by slave device 4. For this purpose, slave device 4 particularly has a receiving device 9.

Method Step S4:
Predetermined bit pattern B is extracted from received frame R. For this purpose, slave device 4 particularly has an extracting device 10.

Method Step S5:
Slave device 4 is outfitted with a phase-locked, loop 5. Phase-locked loop 5 has at least one free-running voltage-controlled oscillator 6 and a phase detector 7. Voltage-controlled oscillator 6 (VCO) is designed in such a way that its output frequency FA is controlled by its input voltage UE (see FIG. 3). Output voltage UA of phase detector 7 is provided as a function of a phase difference between output frequency FA of voltage-controlled oscillator 6 and extracted, predetermined bit pattern B. Input voltage UE of voltage-controlled oscillator 6 is at least a function of output voltage UA of phase detector 7, or is equivalent to it. Furthermore, voltage-controlled oscillator 6 is able to be operated in a frequency range which has the clock frequency T of CAN bus 1.

Method Step S6:
Phase-locked loop 5 is operated using extracted, predetermined bit pattern B as a reference signal for the recovery of the clock frequency T of CAN bus 1 in slave device 4.

Figure 2:
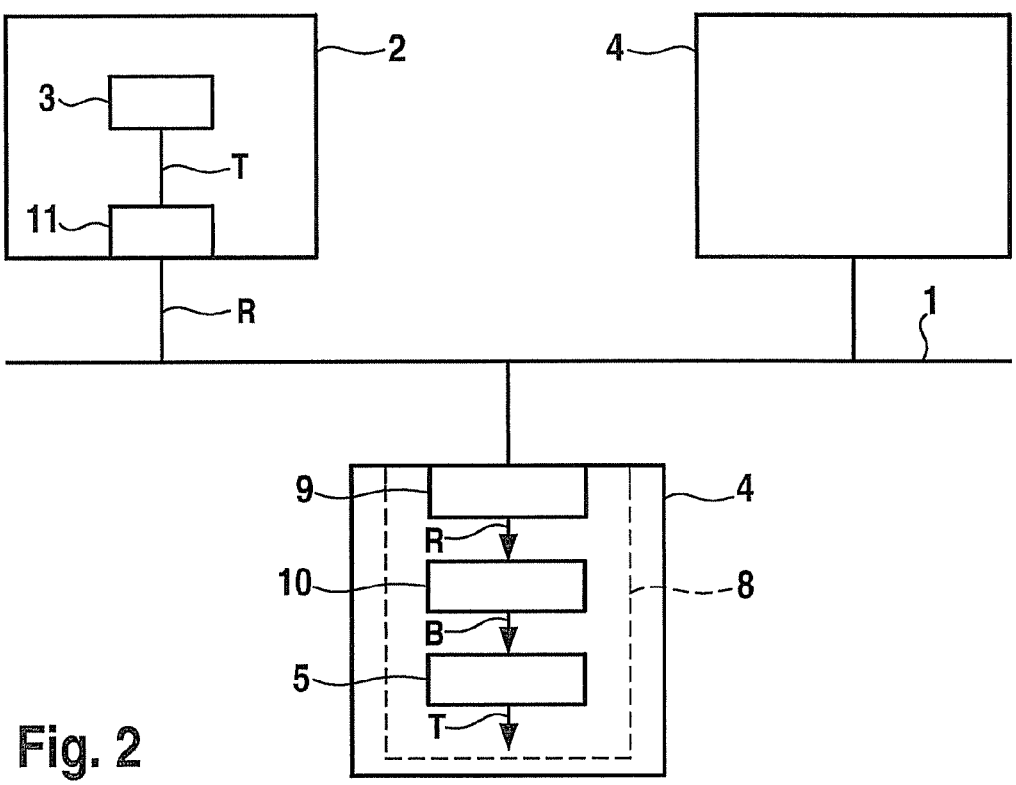
FIG. 2 shows a schematic block diagram of an exemplary embodiment of a CAN bus system according to the present invention.

In this context, FIG. 2 shows an exemplary embodiment of a CAN system having a CAN bus 1, a master device 2 and two slave devices 4. The number of slave devices 4 in the CAN bus system is generally N−1. Without limiting the generality, only two slave devices 4 are shown for the simplified representation in FIG. 2.

CAN bus 1 couples master device 2 to slave devices 4. Master device 2 in particular has one clock generator 3 and one sending device 11. Clock generator 3 provides a clock frequency T for CAN bus 1. Sending device 11 sends frames R at clock frequency T via CAN bus 1. Frames R each have at least one predetermined bit pattern B. Sending device 11 particularly sends respectively one frame R via CAN bus 1, at least at predetermined sending times. In each case, the sending times are particularly at a distance from one another in such a way that the pauses between frames R or CAN messages do not become too long for the recovery of clock frequency T. The CAN activity on CAN bus 1 is particularly dominated by CAN master 2 that is outfitted with clock generator 3, or master device 2.

At the respective sending time, sending device 11 particularly sends a data frame which has a header part, having the predetermined bit patterns B, and a data part having useful data, in case, at the respective sending time, there is present at the master device 2 a data frame that is to be sent. If, however, at the respective sending time, there is no data frame, that is to be sent, present at master device 2, sending device 11 sends a dummy frame which has at least one header part having the predetermined bit pattern B. The dummy frame for minimizing the load of CAN bus 1 preferably has no data part.

Respective slave device 4 has at least one CAN bus driver 8. CAN bus driver 8 is suitable for recovering clock frequency T of CAN bus 1. CAN bus driver 8 has a receiving device 9, an extracting device 10 and a phase-locked loop 5. Receiving device 9 receives frame R that is sent via CAN bus 1 by master device 2. Frames R each have at least one predetermined bit pattern B. Extraction device 10 extracts predetermined bit pattern B from respectively received frames R. Phase-locked loop 5 uses, as reference signal, extracted, predetermined bit pattern B for the recovery of clock frequency T of CAN bus 1 in slave device 4. Bit pattern B may come from the receiving message, if the master device supports special synchronization frames for the slave device.

Figure 3:
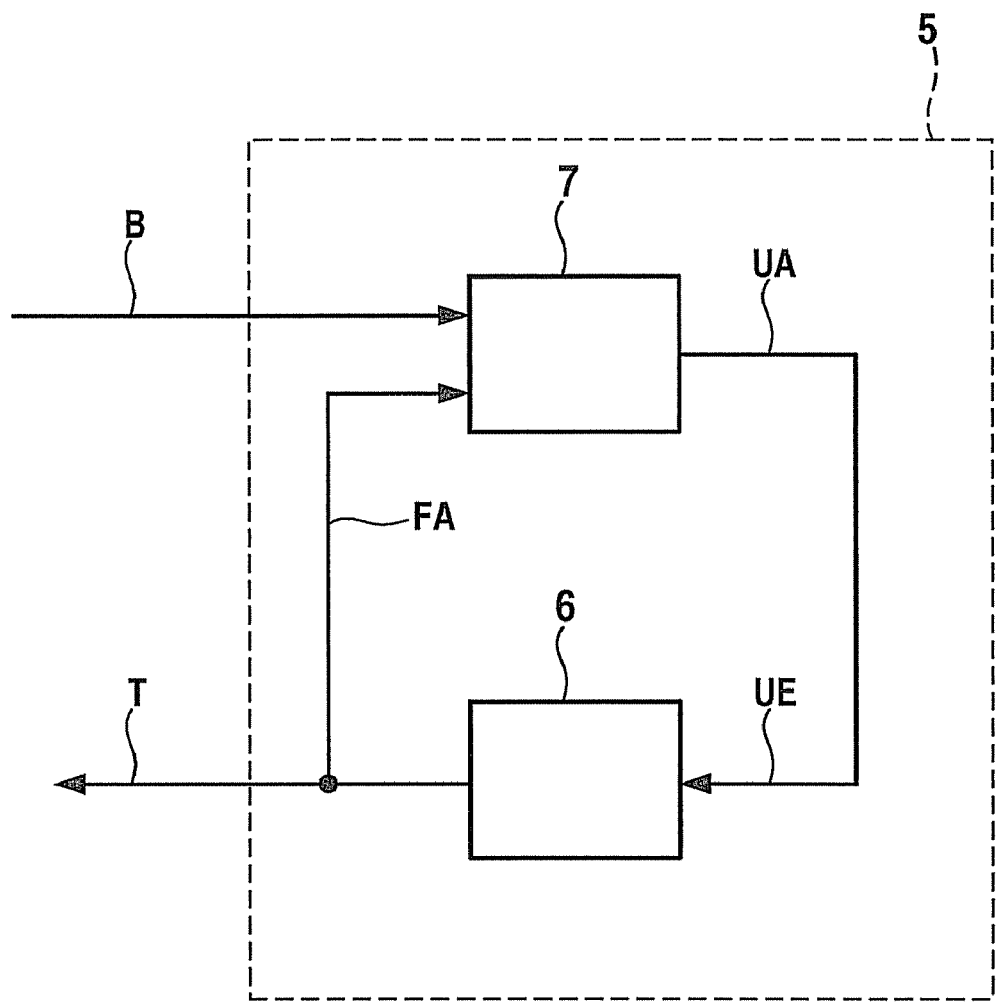
FIG. 3 shows a schematic block diagram of an exemplary embodiment of the phase-locked loop according to the present invention.

FIG. 3 shows an exemplary embodiment of phase-locked loop 5. Phase-locked loop 5 has at least one free-running voltage-controlled oscillator 6 and a phase detector 7. Voltage-controlled oscillator 6 is designed so that its output frequency FA is controlled by its input voltage UE. Output voltage UA of phase detector 7 is provided as a function of a phase difference between output frequency FA of voltage-controlled oscillator 6 and extracted, predetermined bit pattern B. Input voltage UE of voltage-controlled oscillator 6 is at least a function of output voltage UA of phase detector 7, or is equivalent to it. Voltage-controlled oscillator 6 is particularly operable in a predetermined frequency range, which particularly has a clock frequency T of CAN bus 1 in its middle range.

In particular, phase-locked loop 5 is operated at least up to an adjusted state at which output frequency FA of voltage-controlled oscillator 6 is at least generally equivalent to clock frequency T of CAN bus 1. Predetermined bit pattern B is particularly a synchronization pattern of a codec.

Although the present invention has been described above on the basis of the preferred exemplary embodiments, it is not limited to these, but may be modified in many ways.

In particular, synchronization is carried out only for valid frames which, for example, is acknowledged using an acknowledge message. It is also possible that error frames are forced in case the phase-locked loop loses its synchronization. A new synchronization is then able to take place rapidly, particularly since the bit pattern is already known to the slave device from the preceding frame.

What is claimed is:

1. A method for recovering a clock frequency of a CAN bus having a master device that has a clock generator, and at least one slave device, the method comprising:
    a) providing the clock frequency by the clock generator;
    b) sending by the master device via the CAN bus at least one frame that includes at least one predetermined bit pattern, at the provided clock frequency;
    c) receiving by the slave device the frame sent;
    d) extracting the predetermined bit pattern from the received frame;
    e) equipping the slave device with a phase-locked loop; and
    f) operating the phase-locked loop using the extracted, predetermined bit pattern as a reference signal for the recovery of the clock frequency of the CAN bus in the slave device.

2. The method as recited in claim 1, wherein the phase-locked loop has at least one free-running voltage-controlled oscillator whose output frequency is controlled by an input voltage, and a phase detector whose output voltage is provided as a function of a phase difference between the output frequency of the voltage-controlled oscillator and the extracted, predetermined bit pattern, the input voltage of the voltage-controlled oscillator being a function at least of the output voltage of the phase detector and the voltage-controlled oscillator being operable in a predetermined frequency range that has the clock frequency of the CAN bus.

3. The method as recited in claim 1, wherein the phase-locked loop has at least one free-running voltage-controlled oscillator whose output frequency is controlled by an input voltage, and a phase detector whose output voltage is provided as a function of a phase difference between the output frequency of the voltage-controlled oscillator and the extracted, predetermined bit pattern, the input voltage of the voltage-controlled oscillator being equivalent to the output voltage of the phase detector, and the voltage-controlled oscillator being operable in a predetermined frequency range that has the clock frequency of the CAN bus.

4. The method as recited in claim 2, wherein the phase-locked loop is operated at least up to an adjusted state, at which the output frequency of the voltage-controlled oscillator is at least generally equivalent to the clock frequency of the CAN bus.

5. The method as recited in claim 1, wherein the master device sends respectively one frame via the CAN bus, at least at predetermined sending times.

6. The method as recited in claim 5, wherein the master device sends a data frame at a respective sending time, which has a header part having the predetermined bit pattern and a data part if there is a data frame present at the master device at the respective sending time, and sends a dummy frame which has at least one header part having the predetermined bit pattern if there is no data frame that is to be sent present at the master device, at the respective sending time.

7. The method as recited in claim 1, wherein the predetermined bit pattern is a synchronization pattern.

8. The method as recited in claim 1, wherein the clock generator is an oscillator having a quartz oscillator.

9. A CAN bus driver for recovering a clock frequency of a CAN bus which couples a master device, that has a clock generator which provides the clock frequency of the CAN bus to at least one slave device, comprising:
    a) a receiving device which receives frames sent by the master device via the CAN bus, which each include at least one predetermined bit pattern;
    b) an extraction device that extracts the predetermined bit pattern from the respective received frame; and
    c) a phase-locked loop which uses as a reference signal the extracted, predetermined bit pattern for the recovery of the clock frequency of the CAN bus in the slave device.

10. The CAN bus driver as recited in claim 9, wherein the phase-locked loop includes at least one free-running voltage-controlled oscillator whose output frequency is controlled by an input voltage, and a phase detector whose output voltage is provided as a function of a phase difference between the output frequency of the voltage-controlled oscillator and the extracted, predetermined bit pattern, the input voltage of the voltage-controlled oscillator being a function at least of the output voltage of the phase detector, and the voltage-controlled oscillator being operable in a predetermined frequency range that has the clock frequency of the CAN bus.

11. The CAN bus driver as recited in claim 9, wherein the phase-locked loop is operated at least up to an adjusted state, at which the output frequency of the voltage-controlled oscillator is at least generally equivalent to the clock frequency of the CAN bus.

12. The CAN bus driver as recited in claim 9, wherein the predetermined bit pattern is a synchronization pattern.

13. A CAN bus system, comprising:
    a) a CAN bus which couples a master device to at least one slave device;
    b) a master device, which has:
        b1) a clock generator adapted to provide a clock frequency for the CAN bus;
        b2) a sending device adapted to send frames, having the clock frequency, via the CAN bus, which each include at least one predetermined bit pattern; and
    c) at least one slave device which includes at least one CAN bus driver, the CAN bus driver including:
        a) a receiving device which receives frames, sent by the master device via the CAN bus, which each include at least one predetermined bit pattern;

b) an extraction device that extracts the predetermined bit pattern from the respective received frame; and c) a phase-locked loop which uses as a reference signal the extracted, predetermined bit pattern for the recovery of the clock frequency of the CAN bus in the slave device.

14. The CAN bus system as recited in claim 13, wherein the clock generator is an oscillator having a quartz oscillator.

15. The CAN bus system as recited in claim 13, wherein the sending device is adapted to send respectively a frame via the CAN bus, at least at predetermined sending times.

16. The CAN bus system as recited in claim 13, wherein the sending device is adapted to send a data frame, at a respective sending time, which has a header part having the predetermined bit pattern and a data part, if there is a data frame present that is to be sent at the master device at the respective sending time, and adapted to send a dummy frame, which has at least one header part having the predetermined bit pattern, if there is no data frame that is to be sent present at the master device at the respective sending time.

* * * * *

UNITED STATES PATENT AND TRADEMARK OFFICE
CERTIFICATE OF CORRECTION

PATENT NO. : 8,356,201 B2
APPLICATION NO. : 12/524883
DATED : January 15, 2013
INVENTOR(S) : Josef Newald It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 799 days.

Signed and Sealed this
First Day of September, 2015

Michelle K. Lee
*Director of the United States Patent and Trademark Office*